US006738306B2

(12) United States Patent
McLaury

(10) Patent No.: US 6,738,306 B2
(45) Date of Patent: May 18, 2004

(54) SRAM CELL WITH SINGLE-ENDED AND DIFFERENTIAL READ/WRITE PORTS

(75) Inventor: Loren McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/242,809

(22) Filed: Sep. 13, 2002

(65) Prior Publication Data

US 2004/0052147 A1 Mar. 18, 2004

(51) Int. Cl.[7] ................................................. G11C 8/00
(52) U.S. Cl. ................... 365/230.05; 365/154; 365/156
(58) Field of Search .......................... 365/230.05, 154, 365/156, 189.01, 189.04, 189.05

(56) References Cited

U.S. PATENT DOCUMENTS

| | | | | |
|---|---|---|---|---|
| 4,660,177 A | * | 4/1987 | O'Connor | 365/156 |
| 5,282,174 A | * | 1/1994 | Little | 365/230.05 |
| 5,477,502 A | * | 12/1995 | Hayashi | 365/230.05 |
| 5,561,638 A | | 10/1996 | Gibson et al. | 365/230.05 |
| 6,078,544 A | | 6/2000 | Park | 365/230.05 |
| 6,288,969 B1 | | 9/2001 | Gibbins et al. | 365/230.05 |
| 6,363,006 B2 | | 3/2002 | Naffziger et al. | 365/154 |

* cited by examiner

Primary Examiner—Gene Auduong
(74) Attorney, Agent, or Firm—Monica H. Choi

(57) ABSTRACT

A SRAM (static random access memory) cell is implemented with at least one double/ended, or differential, port and at least one single-ended port, with each port having read and write functionality. The SRAM cell includes a bistable loop of a first inverter and a second inverter. An input of the first inverter is coupled to an output of the second inverter at a first bistable node, and an input of the second inverter is coupled to an output of the first inverter at a second bistable node. In addition, the SRAM cell includes a single-ended port coupled to one of the bistable nodes and a doubled-ended port coupled to both of the bistable nodes. The two ports are operable to permit simultaneous access to data within the SRAM cell.

21 Claims, 7 Drawing Sheets

SRAM CELL WITH SINGLE-ENDED AND DIFFERENTIAL READ/WRITE PORTS

TECHNICAL FIELD

This invention relates generally to SRAMs (static random access memories) and, more particularly, to a SRAM (static random access memory) cell having multiple ports.

BACKGROUND

A SRAM (static random access memory) is known to one of ordinary skill in the art of electronics for storing data without need for periodic refresh of data. A SRAM is comprised of an array of SRAM cells. For some applications, data of the SRAM is simultaneously shared by a plurality of memory accessing devices. For such applications, the SRAM cell of the SRAM array is a multiport SRAM cell for providing access to the data of the SRAM cell by a plurality of memory accessing devices.

FIG. 1 shows an example multiport SRAM cell 100 of the prior art as described in U.S. Pat. No. 6,097,664 to Nguyen et al. The SRAM cell 100 of FIG. 1 includes a bistable loop of a first inverter 102 and a second inverter 104. The first inverter 102 is comprised of a first PMOSFET (P-channel metal oxide semiconductor field effect transistor) 106 and a first NMOSFET (N-channel metal oxide semiconductor field effect transistor) 108 coupled between a positive power supply $V_{CC}$ 119 and the ground node 121. The second inverter 104 is comprised of a second PMOSFET 110 and a second NMOSFET 112 coupled between the positive power supply $V_{CC}$ 119 and the ground node 121. The input of the first inverter 102 is coupled to the output of the second inverter 104 at a first bistable node 114, and the input of the second inverter 104 is coupled to the output of the first inverter 102 at a second bistable node 116. The first and second bistable nodes 114 and 116 store the data of the SRAM cell 100, as known to one of ordinary skill in the art of electronics.

In addition, the SRAM cell 100 includes a third inverter 118, which is a read driver inverter, having an input coupled to the second bistable node 116. The third inverter 118 is comprised of a third PMOSFET 120 and a third NMOSFET 122 coupled between the positive power supply $V_{CC}$ 119 and the ground node 121. The output of the third inverter 1 18 is coupled to inputs of a first pass gate 124 and a second pass gate 126. First read access control signals RA1 and RA1* (the complement of RA1) are provided by a first memory accessing device to the first pass gate 124 for reading the data at the second bistable node 116, via the read driver inverter 118, of the SRAM cell 100 as output signal RD1. Second read access control signals RA2 and RA2* (the complement of RA2) are provided by a second memory accessing device to the second pass gate 126 for reading the data at the second bistable node 116, via the read driver inverter 118, of the SRAM cell 100 as output signal RD2. The first and second pass gates 124 and 126 are comprised of a pair of a PMOSFET and an NMOSFET, and such implementation of pass gates is known to one of ordinary skill in the art of electronics.

Furthermore, the SRAM cell 100 includes a third pass gate 128 coupled to the first bistable node 114. One of the first or second memory accessing devices provides first write access control signals WA1 and WA1* (the complement of WA1) to the third pass gate 128 for writing input data WD1 to the first bistable node 114 of the SRAM cell 100. The third pass gate 128 is comprised of a pair of a PMOSFET and an NMOSFET, and such implementation of a pass gate is known to one of ordinary skill in the art of electronics.

Additionally, a pass transistor 130 is coupled to the first bistable node 114. A memory accessing device provides access control signal WA2 to the pass transistor 130 for either reading data R/WD2 from the first bistable node 114 of the SRAM cell 100 or for writing data R/WD2 to the SRAM cell 100. For example, the memory accessing device coupled to the pass transistor 130 includes portions 132 and 136 of a serial boundary scan subsystem. The portion 136 of the serial boundary scan subsystem functions to serially provide data R/WD2 to be written into the SRAM cell 100 or alternatively to serially receive data R/WD2 read from the SRAM cell 100, from or into a respective location 138 of the portion 136 of the serial boundary scan subsystem. The portion 132 of the serial boundary scan subsystem functions to serially provide the access control signal WA2 from the respective location 134 of the portion 132 of the serial boundary scan subsystem.

The portions 132 and 136 of the serial boundary scan subsystem are used for writing and reading initial configuration data to be stored by the SRAM cell 100, as described in U.S. Pat. No. 6,097,664 to Nguyen et al. The portions 132 and 136 of the serial boundary scan subsystem are typically already present within a memory system such that such initial configuration data may be stored into the SRAM cell 100 without significant added circuitry of the memory system. In addition, by using a single pass transistor 130 (instead of a two-MOSFET pass gate), the metal lines from the portions 132 and 136 of the serial boundary scan subsystem for writing and verifying the initial configuration data within the SRAM cell 100 are advantageously minimized.

In the SRAM cell 100, the first PMOSFET 106 and the first NMOSFET 108 of the first inverter 102 are sized to be larger than the second PMOSFET 110 and the second NMOSFET 112, respectively, of the second inverter 104. Thus, the W/L (i.e., the width over length) ratio of the first PMOSFET 106 is larger than the W/L (i.e., the width over length) ratio of the second PMOSFET 110, and the W/L (i.e., the width over length) ratio of the first NMOSFET 108 is larger than the W/L (i.e., the width over length) ratio of the second NMOSFET 112.

In that case, the MOSFETs 106 and 108 of the first inverter 102 have higher transconductance, $G_M$, than that of the MOSFETs 110 and 112 of the second inverter 104. As a result, for writing data into the SRAM cell 100, the write data via the third pass gate 128 or via the pass transistor 130 is applied on the input (i.e., the first bistable node 114) of the first inverter 102 rather than on the input of the second inverter 104. The output 116 of the first inverter 102 with the MOSFETs 106 and 108 having higher transconductance over-powers the output 114 of the second inverter 104. Thus, the write data for the write operation is applied on the input (i.e., the first bistable node 114) of the first inverter 102 for proper write operation when the MOSFETs 106 and 108 of the first inverter 102 have higher transconductance than that of the MOSFETs 110 and 112 of the second inverter 104.

Because the MOSFETs of the first and second inverters 102 and 104 are differently sized, the multiports comprising the first, second, and third pass gates 124, 126, 128 and the pass transistor 130 are each single-ended, accessing only one of the first or second bistable nodes 114 and 116. The ports comprising the first and second pass gates 124 and 126 access the single second bistable node 116 via the read driver inverter 118 for reading data from the SRAM cell 100. The ports comprising the third pass gate 128 and the pass transistor 130 access the single first bistable node 114 for writing data to the SRAM cell 100. The port comprising the pass transistor 130 also accesses the single first bistable node 114 for reading data from the SRAM cell 100.

A disadvantage of the SRAM cell 100 of FIG. 1 is that each of the multiports comprising the first, second, and third pass gates 124, 126, 128 does not have the dual functionality of both reading and writing to the SRAM cell 100. The ports of the SRAM cell 100 comprising the first and second pass gates 124 and 126 are read only, and the port comprising the third pass transistor 128 is write only. In addition, because the ports of the SRAM cell 100 comprising the first, second, and third pass gates 124, 126, and 128 and the pass transistor 130 are single-ended, such ports are prone to signal deterioration from noise.

FIG. 2 shows another multiport SRAM cell 150 for providing both read and write functionality for each port that is single-ended. Elements having the same reference number in FIGS. 1 and 2 refer to elements having similar structure and function. The SRAM cell 150 of FIG. 2 includes the bistable loop comprised of the first inverter 102 and the second inverter 104 as described for the SRAM cell 100 of FIG. 1. In addition, the third inverter 118 is coupled to the second bistable node 116 for providing access to the data of the SRAM cell 150. In addition, the MOSFETs of the first and second inverters 102 and 104 of FIG. 2 are differently sized as already described herein with reference to FIG. 1.

The SRAM cell 150 of FIG. 2 includes a first pass gate 152, a second pass gate 154, and a third pass gate 156 comprising a first port. The SRAM cell 150 also includes a fourth pass gate 158, a fifth pass gate 160, and a sixth pass gate 162 comprising a second port. A first memory accessing device provides RW1 and RW1* (the complement of the RW1 signal) control signals for accessing the SRAM cell 150. In addition, the first memory accessing device provides WA1 and WA1* (the complement of the WA1 signal) control signals for accessing the first bistable node 114 of the SRAM cell 150 to write data R/WD1 into the SRAM cell 150. Furthermore, the first memory accessing device provides RA1 and RA1* (the complement of the RA1 signal) control signals for accessing the second bistable node 116 via the read driver inverter 118 of the SRAM cell 150 to read data R/WD1 from the SRAM cell 150.

Similarly, a second memory accessing device provides the RW2 and RW2, (the complement of the RW2 signal) control signals for accessing the SRAM cell 150. In addition, the second memory accessing device provides WA2 and WA2* (the complement of the WA2 signal) control signals for accessing the first bistable node 114 of the SRAM cell 150 to write data R/WD2 into the SRAM cell 150. Furthermore, the second memory accessing device provides RA2 and RA2* (the complement of the RA2 signal) control signals for accessing the second bistable node 116 via the read driver inverter 118 of the SRAM cell 150 to read data R/WD2 from the SRAM cell 150.

The pass transistor 130 in FIG. 2 comprises a third port similar to the pass transistor 130 of FIG. 1 for providing read and write access to the first bistable node 114 of the SRAM cell 150. A third memory accessing device provides the access control signal SA to the pass transistor 130 for accessing the first bistable node 114 to read or write data R/WSD from or to the SRAM cell 150.

Because the MOSFETs of the first and second inverters 102 and 104 of FIG. 2 are differently sized, the multiports comprising the plurality of pass gates 152, 154, 156, 158, 160, and 162 and the pass transistor 130 are each single-ended accessing only one of the first or second bistable nodes 114 and 116 for each one of the read or write function, and such ports are prone to signal deterioration from noise. In addition, the SRAM cell 100 of FIG. 1 is comprised of thirteen MOSFETs, and the SRAM cell 150 of FIG. 2 is comprised of nineteen MOSFETs. When the SRAM cell is used in application within a register file comprised of thousands of SRAM cells, the number of MOSFETs for implementing a SRAM cell is not as critical. However, when the SRAM cell is used in application with a data processor within a memory system comprised of millions of SRAM cells, the number of MOSFETs for implementing a SRAM cell is desired to be minimized for in turn minimizing the area of the memory system comprised of such SRAM cells.

Thus, a SRAM cell is desired that provides a single-ended port and a differential port with a minimum number of transistors.

SUMMARY

Accordingly, in a general aspect of the present invention, a SRAM cell is implemented with at least one differential port and at least one single-ended port.

In one example embodiment, a multiport SRAM (static random access memory) cell comprises a bistable loop of a first inverter and a second inverter. An input terminal of the first inverter is coupled to an output terminal of the second inverter at a first bistable node, and an input terminal of the second inverter is coupled to an output terminal of the first inverter at a second bistable node. In addition, a single-ended port is coupled to one of the first bistable node or the second bistable node, and a differential port is coupled to both of the first and second bistable nodes.

In another aspect of the present invention, a multiport SRAM (static random access memory) cell comprises a bistable loop of a first inverter and a second inverter. An input terminal of the first inverter is coupled to an output terminal of the second inverter at a first bistable node, and an input terminal of the second inverter is coupled to an output terminal of the first inverter at a second bistable node. A single-ended port is coupled to one of the first bistable node or the second bistable node and is operable to both read data from and write data to the coupled bistable node through a same transistor. A differential port is coupled to both of the first and second bistable nodes and is operable to both read data from and write data to the coupled bistable nodes through a same pair of transistors.

In a further aspect of the present invention, a multiport SRAM (static random access memory) cell comprises a bistable loop consisting of a first CMOS inverter having first and second transistors and a second CMOS inverter having third and fourth transistors. An input terminal of the first inverter is coupled to an output terminal of the second inverter at a first bistable node, and an input terminal of the second inverter is coupled to an output terminal of the first inverter at a second bistable node. A single-ended port consists of a fifth transistor coupled to one of the first bistable node or the second bistable node, and a differential port consists of a sixth transistor coupled to the first bistable node and a seventh transistor coupled to the second bistable node.

In yet a further aspect of the present invention, a method of accessing data within an SRAM (static random access memory) cell comprises providing a single-ended port within the SRAM cell and providing a differential port within the SRAM cell. In addition, data within the SRAM cell is accessed through the single/ended port simultaneously with accessing data within the SRAM cell through the differential port.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 3:
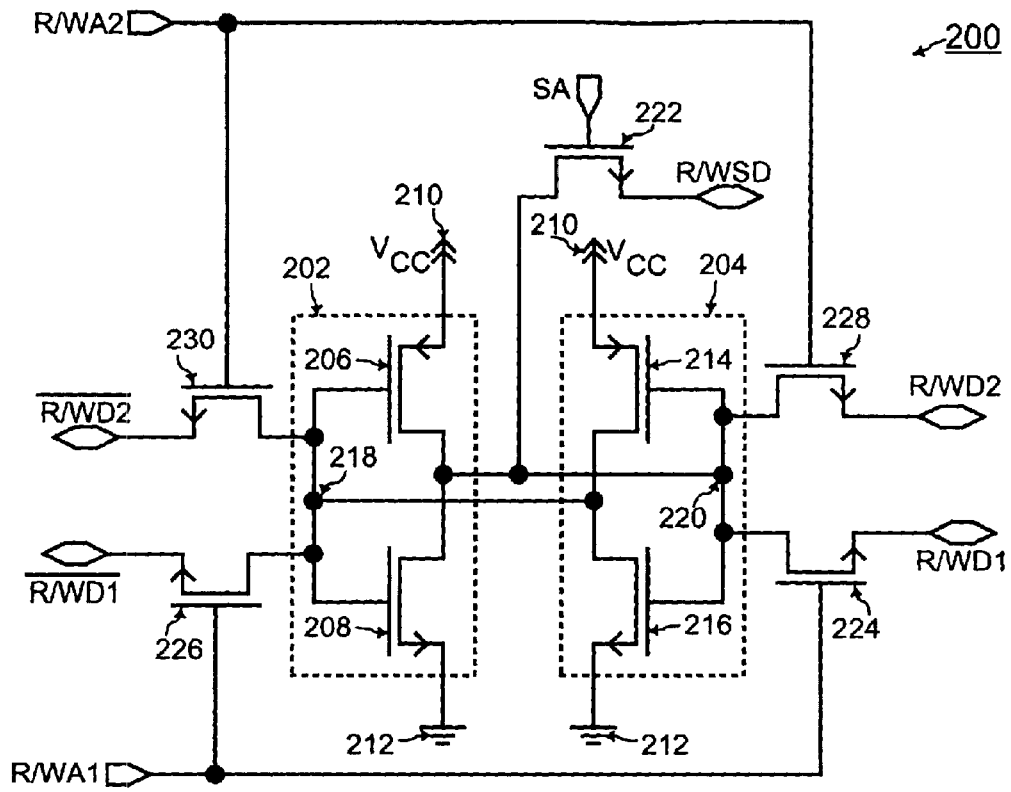
FIG. 3 shows an example implementation of a multiport SRAM cell having at least one single-ended port and at least one double-ended port for implementing multiports with each port having read and write functionality with a minimum number of transistors, according to an embodiment of the present invention.

FIG. 3 shows a multiport SRAM (static random access memory) cell 200 having at least one differential or double-ended port and at least one single-ended port according to an embodiment of the present invention. Note that the terms "differential" and "doubled-ended" as used herein are substantially synonymous. The SRAM cell 200 includes a bistable loop of a first inverter 202 and a second inverter 204. The first inverter 202 is comprised of a first PMOSFET (P-channel metal oxide semiconductor field effect transistor) 206 and a first NMOSFET (N-channel metal oxide semiconductor field effect transistor) 208 coupled between a positive power supply $V_{CC}$ 210 and the ground node 212. The second inverter 204 is comprised of a second PMOSFET 214 and a second NMOSFET 216 coupled between the positive power supply $V_{CC}$ 210 and the ground node 212.

The input of the fist inverter 202 is coupled to the output of the second inverter 204 at a first bistable node 218, and the input of the second inverter 204 is coupled to the output of the first inverter 202 at a second bistable node 220. The first and second bistable nodes 218 and 220 store the data of the SRAM cell 200, as known to one of ordinary skill in the art of electronics. In one embodiment of the present invention, the first PMOSFET 206 and the first NMOSFET 208 of the first inverter 202 are equivalently sized with the second PMOSFET 214 and the second NMOSFET 216, respectively, of the second inverter 204. For example, the W/L (i.e., the width over length) ratio of the first PMOSFET 206 of the first inverter 202 is substantially same as the W/L (i.e., the width over length) ratio of the second PMOSFET 214 of the second inverter 204. Similarly, the W/L (i.e., the width over length) ratio of the first NMOSFET 208 of the first inverter 202 is substantially same as the W/L (i.e., the width over length) ratio of the second NMOSFET 216 of the second inverter 204. Thus, the MOSFETs 206 and 208 of the first inverter 202 have substantially same transconductance, $G_M$, with that of the MOSFETs 214 and 216 of the second inverter 204.

The SRAM cell 200 includes a single-ended port comprised of a single-ended pass transistor 222. (Pass transistor 222 and others described in this embodiment of the invention can be an individual transistor or as part of a multi-transistor transmission gate.) The single-ended pass transistor 222 is an NMOSFET (N-channel metal oxide semiconductor field effect transistor) having a drain coupled to the second bistable node 220 of the bistable loop of the SRAM cell 200, according to one embodiment of the present invention. However, because the MOSFETs 206 and 208 of the first inverter 202 have substantially same transconductance, $G_M$, with that of the MOSFETs 214 and 216 of the second inverter 204, the present invention may be practiced when the drain of the pass NMOSFET 222 is coupled to either one of the first bistable node 218 or the second bistable node 220. The source of the single-ended NMOSFET 222 is coupled to a read or write data node having read or write data R/WSD applied thereon for a first memory accessing device, and the first memory accessing device provides a single-ended accessing control signal SA to the gate of the single-ended NMOSFET 222.

A single-ended read or write operation is performed when a memory accessing device turns on the single-ended pass transistor 222 with the single-ended accessing control signal SA applied on the gate of the single-ended NMOSFET 222. For a single-ended read operation, the memory accessing device senses a voltage (i.e., the read data) at one of the first bistable node 218 or the second bistable node 220 that is coupled to the drain of the pass NMOSFET 222 with the single-ended pass transistor 222 turned on. Alternatively, for a singled-ended write operation, the memory accessing device applies a voltage (i.e., the write data) at one of the first bistable node 218 or the second bistable node 220 that is coupled to the drain of the pass NMOSFET 222 with the single-ended pass transistor 222 turned on.

The SRAM cell 200 further includes a first double-ended port including a first differential pass transistor 224 and a second differential pass transistor 226. In one embodiment of the present invention, the first and second differential pass transistors 224 and 226 are first and second NMOSFETs (N-channel metal oxide semiconductor field effect transistors), respectively. The drain of the first NMOSFET 224 is coupled to one of the first or second bistable nodes 218 or 220, and the drain of the second NMOSFET 226 is coupled to the other one of the first or second bistable nodes 218 or 220. In FIG. 3, the drain of the first NMOSFET 224 is coupled to the second bistable node 220, and the drain of the second NMOSFET 226 is coupled to the first bistable node 218.

In addition, the gates of the first and second NMOSFETs 224 and 226 are coupled together and are both coupled to a second memory accessing device that provides a first differential accessing control signal R/WA1 applied on the gates of the first and second NMOSFETs 224 and 226. In addition, the source of the first NMOSFET 224 is coupled to a first differential read or write data node of the second memory accessing device that applies a first read or write data R/WD1 thereon. The source of the second NMOSFET 226 is coupled to a second differential read or write data node of the second memory accessing device that applies a second read or write data R/WD1* (that is a complement of the read or write data R/WD1 applied on the first differential read or write data node) thereon. The read or write data for the first double-ended port is the difference of the read or write data on the first and second differential read or write data nodes (i.e., R/WD1–R/WD1*).

A double-ended read or write operation is performed via the first double-ended port when a memory accessing device turns on the first and second differential pass NMOSFETs 224 and 226 with the first differential accessing control signal R/WA1 applied on the gates of the first and second differential pass NMOSFETs 224 and 226. For a double-ended read operation, the memory accessing device senses differential read data (i.e., R/WD1 and R/WD1*) at the first and second bistable nodes 218 and 220 coupled to the drains of the first and second differential pass NMOSFETs 224 and 226 that are turned on, using a differential sensing mechanism. The differential sensing mechanism detects for a difference between the differential voltages, R/WD1 and R/WD1*. Such a differential sensing mechanism is known to one of ordinary skill in the art of electronics.

Such a differential sensing mechanism determines a logical state for a digital data bit stored by the SRAM cell 200 from a difference between the differential voltages, R/WD1 and R/WD1*. Such a difference between the differential voltages, R/WD1 and R/WD1*, may be as small as 100 mV (milliVolts). Such a differential sensing mechanism is advantageous for determining the logical state for the digital data bit stored by the SRAM cell 200 from a relatively small voltage swing of hundreds of milliVolts. In contrast, in the single-ended read operation with a single-ended sense mechanism, a voltage level of about 1 Volt or more may be needed for determining the logical state for the digital data bit stored by the SRAM cell 200.

Alternatively, for a double-ended write operation via the first double-ended port, the memory accessing device applies the differential write data, R/WD1 and R/WD1*, on the first and second bistable nodes 218 and 220 coupled to the drains of the first and second differential pass NMOSFETs 224 and 226 that are turned on. Because such differential voltages, R/WD1 and R/WD1*, are applied for affecting the logical state at the first and second bistable nodes 218 and 220, the driving capability of the memory accessing device (and thus the size of the drive transistors of the memory accessing device coupled to the sources of the first and second differential pass NMOSFETs 224 and 226) may advantageously be lower.

The SRAM cell 200 further includes a second double-ended port including a third differential pass transistor 228 and a fourth differential pass transistor 230. In one embodiment of the present invention, the third and fourth differential pass transistors 228 and 230 are third and fourth NMOSFETs (N-channel metal oxide semiconductor field effect transistors), respectively. The drain of the third NMOSFET 228 is coupled to one of the first or second bistable nodes 218 or 220, and the drain of the second NMOSFET 230 is coupled to the other one of the first or second bistable nodes 218 or 220. In FIG. 3, the drain of the third NMOSFET 228 is coupled to the second bistable node 220, and the drain of the fourth NMOSFET 230 is coupled to the first bistable node 218.

In addition, the gates of the third and fourth NMOSFETs 228 and 230 are coupled together and are both coupled to a third memory accessing device that provides a second differential accessing control signal R/WA2 applied on the gates of the third and fourth NMOSFETs 228 and 230. In addition, the source of the third NMOSFET 228 is coupled to a third differential read or write data node of the third memory accessing device that applies a third read or write data R/WD2 thereon. The source of the fourth NMOSFET 230 is coupled to a fourth differential read or write data node of the third memory accessing device that applies a fourth read or write data R/WD2* (that is a complement of the read or write data R/WD2 applied on the third differential read or write data node) thereon. The read or write data for they second double-ended port is the difference of the read or write data on the third and fourth differential read or write data nodes (i.e., R/WD2–R/WD2*).

A double-ended read or write operation is performed via the second double-ended port when a memory accessing device turns on the third and fourth differential pass NMOSFETs 228 and 230 with the second differential accessing control signal R/WA2 applied on the gates of the third and fourth differential pass NMOSFETs 228 and 230. For a double-ended read operation, the memory accessing device senses differential read data (i.e., R/WD2 and R/WD2*) at the first and second bistable nodes 218 and 220 coupled to the drains of the third and fourth differential pass NMOSFETs 228 and 230 that are turned on, using a differential sensing mechanism. The differential sensing mechanism detects for a difference between the differential voltages, R/WD2 and R/WD2*. Such a differential sensing mechanism is known to one of ordinary skill in the art of electronics.

Such a differential sensing mechanism determines a logical state for a digital data bit stored by the SRAM cell 200 from a difference between the differential voltages, R/WD2 and R/WD2*. Such a difference between the differential voltages, R/WD2 and R/WD2*, may be as small as 100 mV (milliVolts). Such a differential sensing mechanism is advantageous for determining the logical state for the digital data bit stored by the SRAM cell 200 from a relatively small voltage swing of hundreds of milliVolts.

Alternatively, for a double-ended write operation via the second double-ended port, the memory accessing device applies the differential write data, R/WD2 and R/WD2*, on the first and second bistable nodes 218 and 220 coupled to the drains of the third and fourth differential pass NMOS-FETs 228 and 230 that are turned on. Because such differential voltages, R/WD2 and R/WD2*, are applied for affecting the logical state at the first and second bistable nodes 218 and 220, the driving capability of the memory accessing device (and thus the size of the drive transistors of the memory accessing device coupled to the sources of the third and fourth differential pass NMOSFETs 228 and 230) may advantageously be lower.

Figure 4:
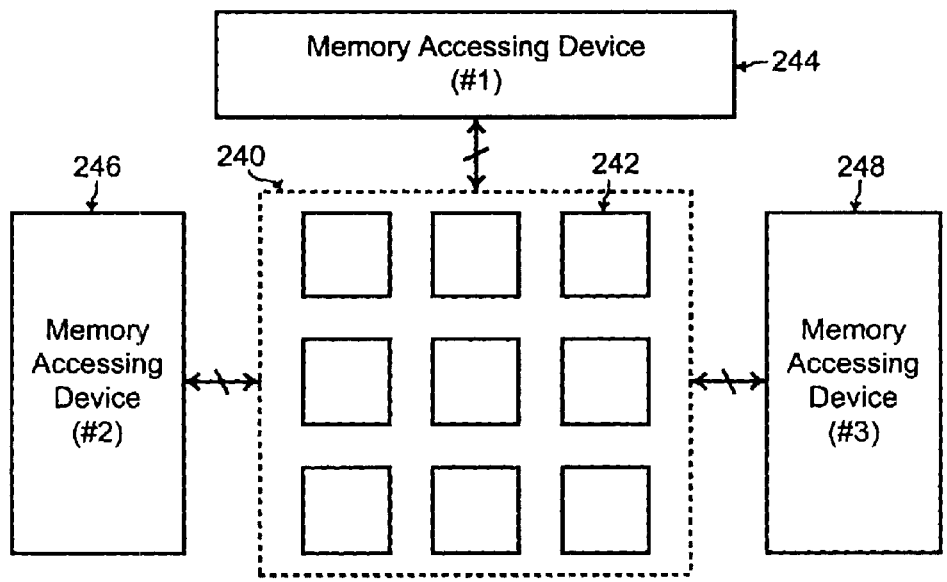
FIG. 4 shows a block diagram of a SRAM system comprising an array of SRAM cells of FIG. 3 with multiple memory accessing devices simultaneously accessing the array of SRAM cells, according to an embodiment of the present invention.

Referring to FIG. 4, a SRAM (static random access memory) system 240 includes an array of SRAM cells 242. Each SRAM cell 242 of the array 240 is implemented as the SRAM cell 200 of FIG. 3, according to one embodiment of the present invention. Referring to FIGS. 3 and 4, the first memory accessing device 244 is coupled to each SRAM cell of the array of SRAM cells 240 for accessing each SRAM cell of the array of SRAM cells 240. The first memory accessing device 244 provides the single-ended accessing control signal SA applied on the gate of the single-ended NMOSFET 222 for accessing a SRAM cell of the array of SRAM cells 240. In addition, the first memory accessing device 244 writes data R/WSD on the source of the single-ended NMOSFET 222 for writing such data to a SRAM cell of the array of SRAM cells 240. Alternatively, the first memory accessing device 244 reads data R/WSD from the source of the single-ended NMOSFET 222 for reading such data from a SRAM cell of the array of SRAM cells 240.

Figure 5:
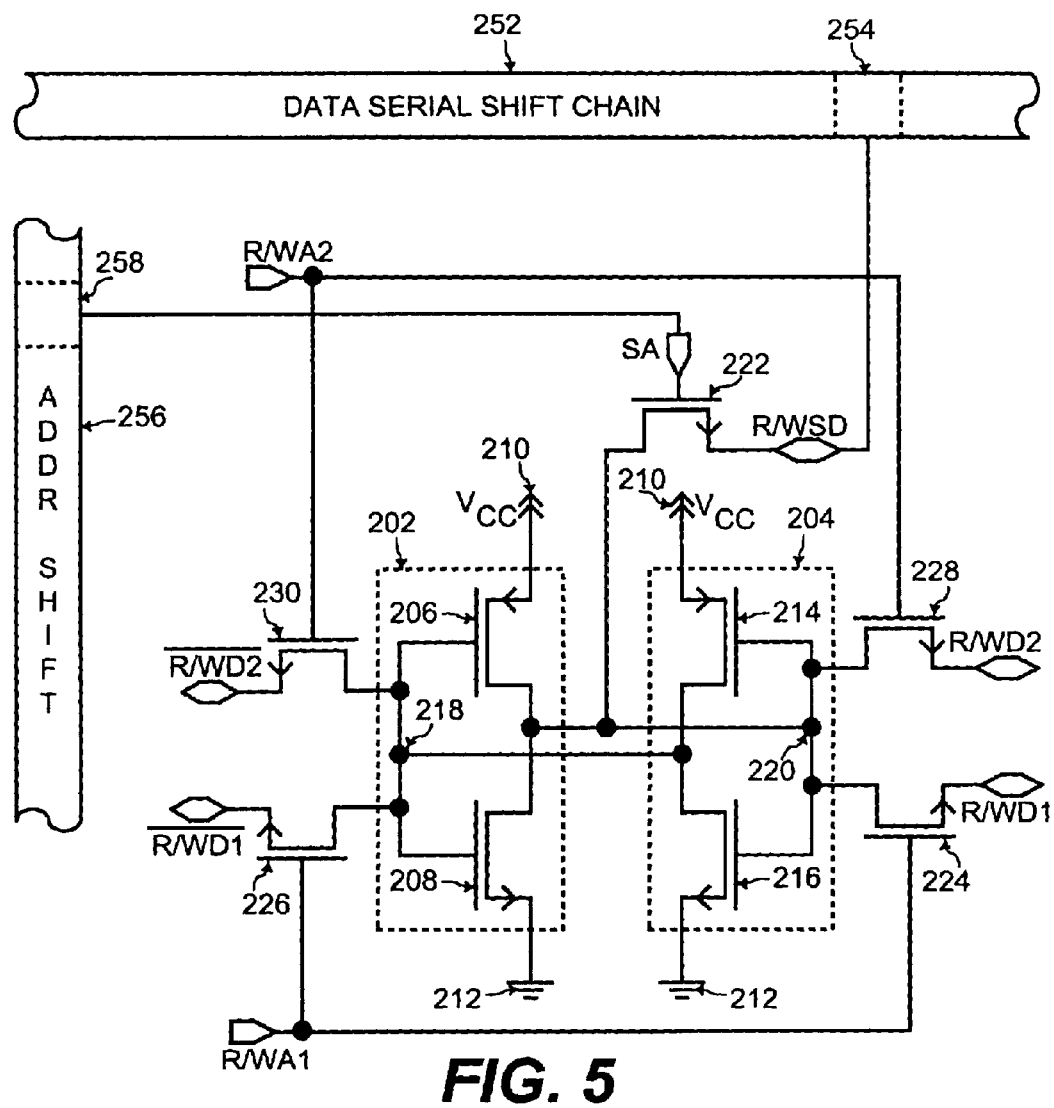
FIG. 5 shows portions of a serial boundary scan subsystem accessing the single-ended port of the SRAM cell of FIG. 3, according to an embodiment of the present invention.

Referring to FIGS. 4 and 5, in one embodiment of the present invention, the first memory accessing device 244 includes portions 252 and 256 of a serial boundary scan subsystem. The portion 252 of the serial boundary scan subsystem functions to serially provide data to be written into the SRAM cell 200 or alternatively to serially receive data read from the SRAM cell 200, from or into a respective location 254 of the portion 252 of the serial boundary scan subsystem. The portion 256 of the serial boundary scan subsystem functions to serially provide the single-ended accessing control signal SA from the respective location 258 of the portion 256 of the serial boundary scan subsystem.

The portions 252 and 256 of the serial boundary scan subsystem are used for writing and reading initial configuration data to be stored by the SRAM cell 200. Such a serial boundary scan subsystem is described in U.S. Pat. No. 6,097,664 to Nguyen et al., and U.S. Pat. No. 6,097,664 to Nguyen et al. is incorporated in its entirety herein by reference. The portions 252 and 256 of the serial boundary scan subsystem are typically already present within a memory system such that such initial configuration data may be stored into the SRAM cell 200 without significant added circuitry of the memory system. In addition, by using a single-ended pass transistor 222 of the single-ended port (instead of a double-ended port), the metal lines from the portions 252 and 256 of the serial boundary scan subsystem for writing and verifying the initial configuration data within the SRAM cell 200 are advantageously minimized.

Figure 6:
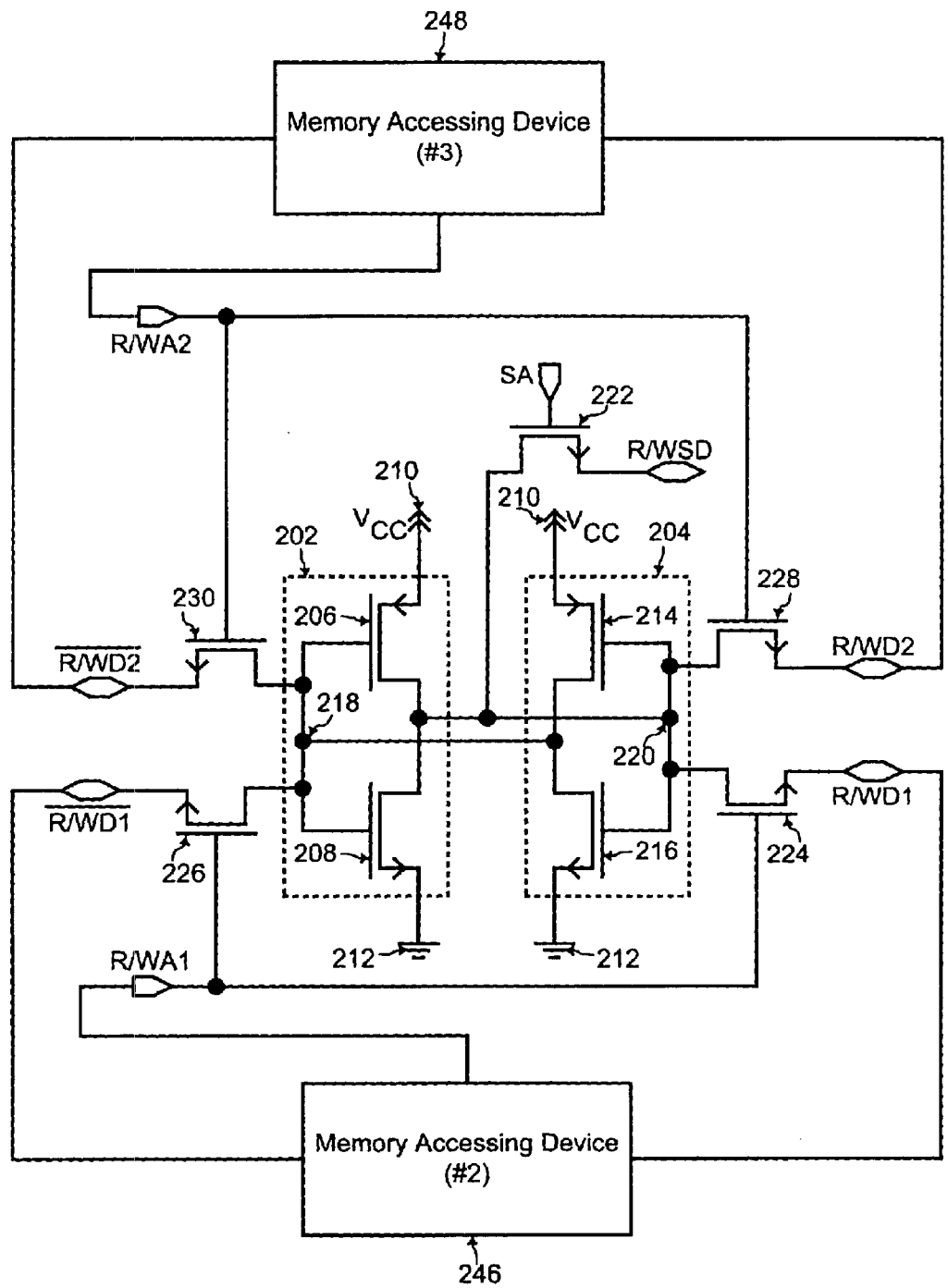
FIG. 6 shows memory accessing devices accessing a plurality of double-ended ports of the SRAM cell of FIG. 3, according to an embodiment of the present invention.

In addition, referring to FIGS. 3, 4, and 6, the second memory accessing device 246 is coupled to each SRAM cell of the array of SRAM cells 240 for accessing each SRAM cell of the array of SRAM cells 240. The second memory accessing device 246 is coupled to the drains and the gates of the respective first and second differential pass transistors 224 and 226 of the respective first double-ended port, for each SRAM cell of the array of SRAM cells 240. The second memory accessing device 246 provides the first differential accessing control signal R/WA1 applied on the gates of the first and second NMOSFETs 224 and 226 for accessing a SRAM cell of the array of SRAM cells 240. In addition, the second memory accessing device 246 writes the differential data R/WD1 and R/WD1* on the sources of the first and second NMOSFETs 224 and 226 for writing such data to a SRAM cell of the array of SRAM cells 240 via the first and second differential read or write data nodes of the first double-ended port. Alternatively, the second memory accessing device 246 reads the differential data R/WD1 and R/WD1 on the sources of the first and second NMOSFETs 224 and 226 for reading such data from a SRAM cell of the array of SRAM cells 240 via the first and second differential read or write data nodes of the first double-ended port.

Furthermore, referring to FIGS. 3, 4, and 6, the third memory accessing device 248 is coupled to each SRAM cell of the array of SRAM cells 240 for accessing each SRAM cell of the array of SRAM cells 240. The third memory accessing device 248 is coupled to the drains and the gates of the respective third and fourth differential pass transistors 228 and 230 of the respective second double-ended port, for each SRAM cell of the array of SRAM cells 240. The third memory accessing device 248 provides the second differential accessing control signal R/WA2 applied on the gates of the third and fourth NMOSFETs 228 and 230 for accessing a SRAM cell of the array of SRAM cells 240. In addition, the third memory accessing device 248 writes the differential data R/WD2 and R/WD2* on the sources of the third and fourth NMOSFETs 228 and 230 for writing such data to a SRAM cell of the array of SRAM cells 240 via the third and fourth differential read or write data nodes of the second double-ended port. Alternatively, the third memory accessing device 248 reads the differential data R/WD2 and R/WD2* on the sources of the third and fourth NMOSFETs 228 and 230 for reading such data from a SRAM cell of the array of SRAM cells 240 via the third and fourth differential read or write data nodes of the second double-ended port.

In one embodiment of the present invention, the single-ended port and the first and second double-ended ports may simultaneously read or write data from or to a SRAM cell 200. In that case, the first, second, and third memory accessing devices 244, 246, and 248 each determines when data within the SRAM cell 200 is valid. Mechanisms for the each of the first, second, and third memory accessing devices 244, 246, and 248 each determining when data within the SRAM cell 200 is valid are known to one of ordinary skill in the art of memory technology.

In another embodiment of the present invention, when accessing data within the SRAM cell 200, with the single-ended port and a double ended port within the SRAM cell 200, data within the SRAM cell 200 is accessed through the single-ended port simultaneously with accessing of data within the SRAM cell 200 through the double-ended port. For example, data from the SRAM cell is read simultaneously through the single-ended and differential ports. Or, data from the SRAM cell is read through the single-ended port simultaneously with writing data to the SRAM cell through the differential port. Alternatively, data from the SRAM cell is read through the differential port simultaneously with writing data to the SRAM cell through the single-ended port.

Figure 1:
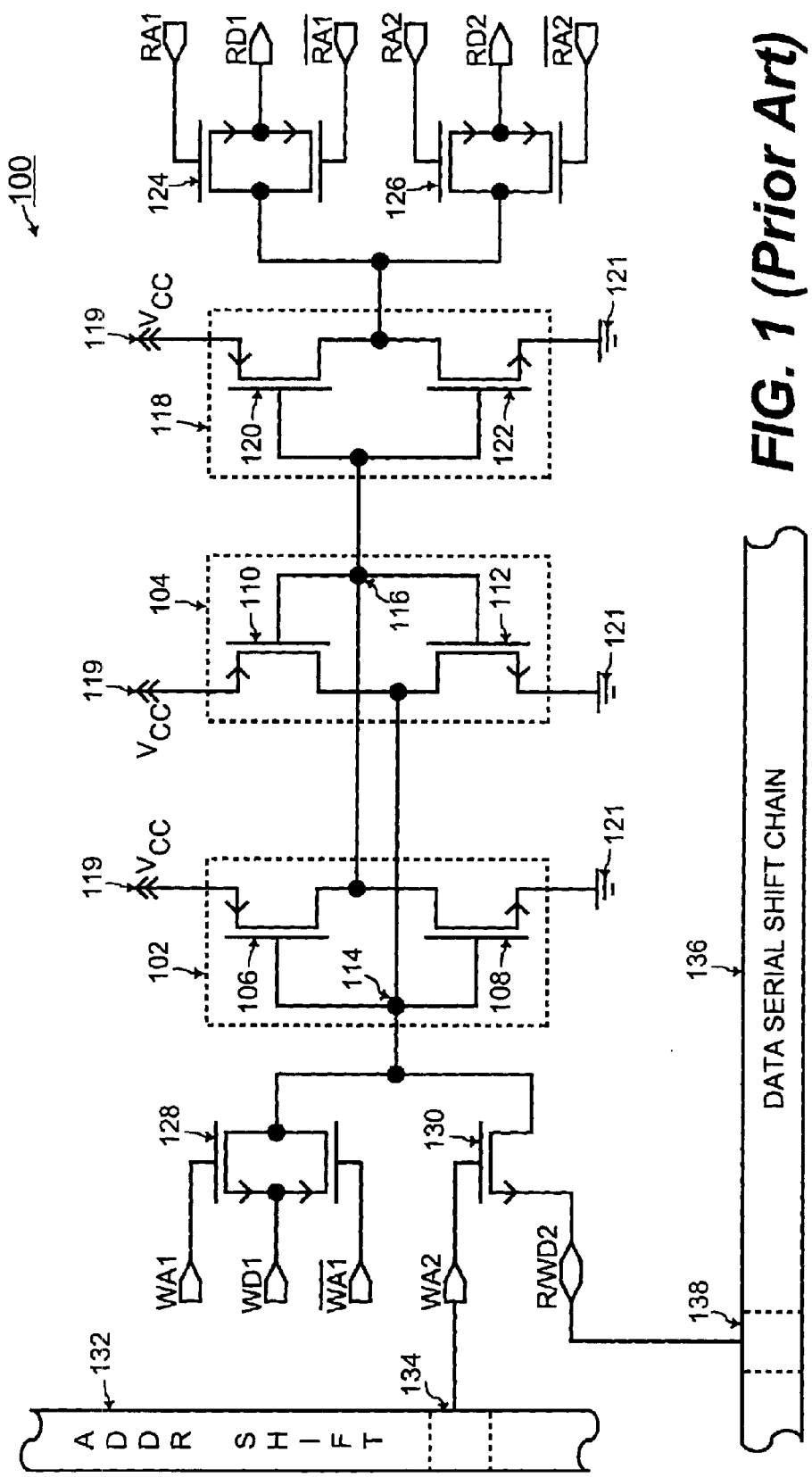
FIG. 1 shows an example implementation of a multiport SRAM cell with each single-ended port having single-ended access to one of the bistable nodes of a bistable loop for each of a read or write function, as known in the prior art.
Figure 2:
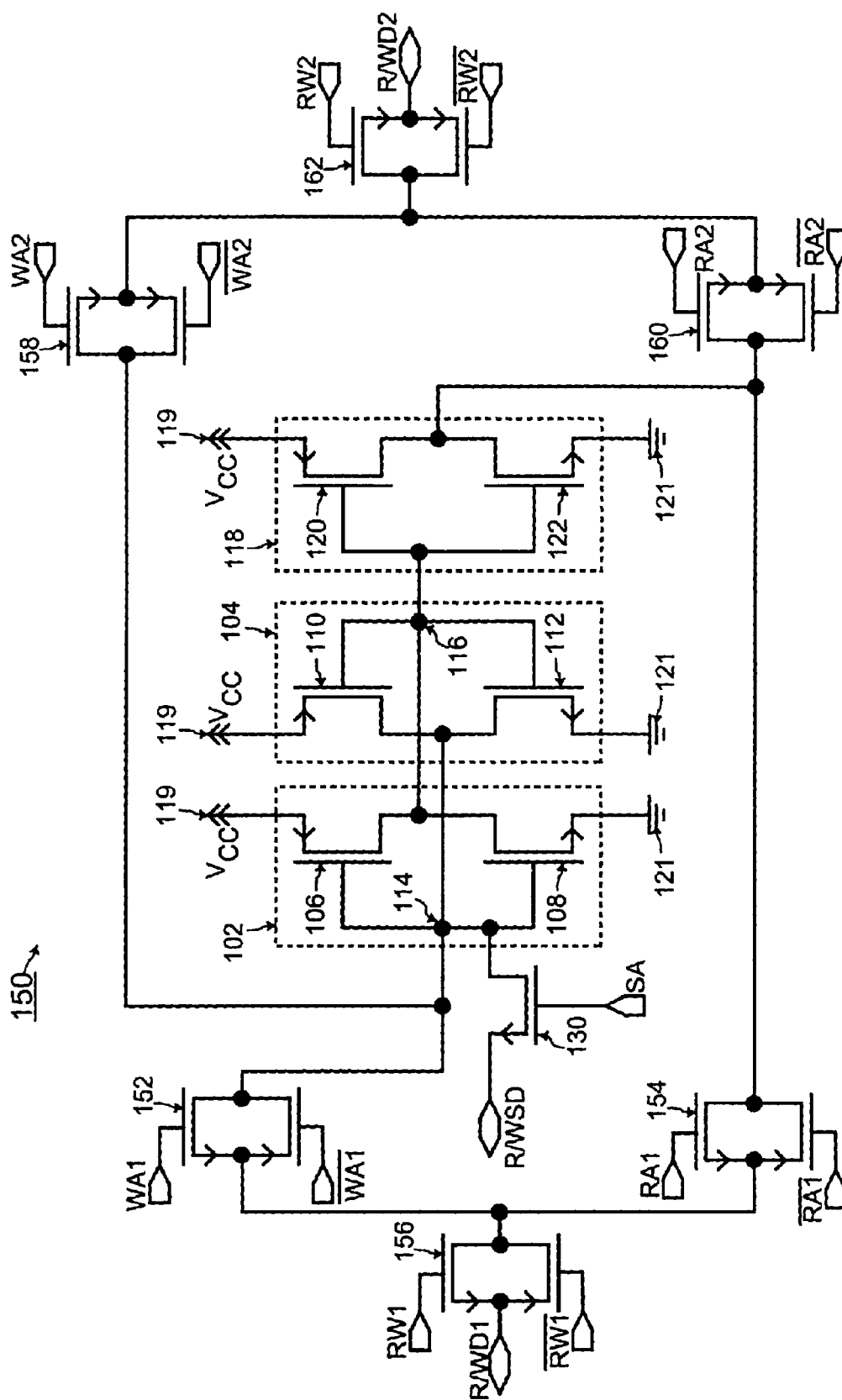
FIG. 2 shows another example implementation of a multiport SRAM cell with each port having read and write functionality with single-ended access to one of the bistable nodes of the bistable loop for each of the read or write function, as known in the prior art.

In this manner, each of the first and second double-ended ports and the single-ended port reads and writes data from and to each SRAM cell 200 of the array of SRAM cells 240. Thus, the SRAM cell 200 of FIG. 3 of the present invention has the same functionality of the prior art SRAM cell 150 of FIG. 2. However, the SRAM cell 200 of the present invention is implemented with only nine transistors which is significantly reduced from the nineteen transistors for implementing the prior art SRAM cell 150 of FIG. 2. Such a SRAM cell 200 is especially advantageous when the SRAM cell 200 is used within a memory system comprised of millions of SRAM cells for minimizing the area of the memory system.

Additionally, double-ended ports of the SRAM cell 200 are further advantageous for rejecting common mode noise and for faster operation of the SRAM cell 200. Furthermore, a double-ended port is used for a double-ended read operation using a differential sensing mechanism that detects for a difference between the differential voltages, R/WD and R/WD*. Such a differential sensing mechanism determines a logical state for a digital data bit stored by the SRAM cell 200 from a difference between the differential voltages, R/WD and R/WD*. Such a differential sensing mechanism is advantageous for determining the logical state for the digital data bit stored by the SRAM cell 200 from a relatively small voltage swing of hundreds of millivolts. Additionally, by using a double-ended port for a double-ended write operation, differential voltages, R/WD and R/WD*, are applied for affecting the logical state at the first and second bistable nodes 218 and 220 such that the transconductance of the drive transistors of the memory accessing device coupled to the sources of the differential pass transistors may advantageously be lower.

It will be understood by those of skill in the art that the foregoing description is only exemplary of the invention and is not intended to limit its application to the structure and operation described herein. For example, the SRAM cell 200 may be used for any other application desiring an SRAM cell 200 having multiports with each port having read and write functionality and implemented with a minimum number of transistors. In addition, other types of devices (aside from MOSFETs) may be used for implementing the SRAM cell 200 of FIG. 3.

Figure 7:
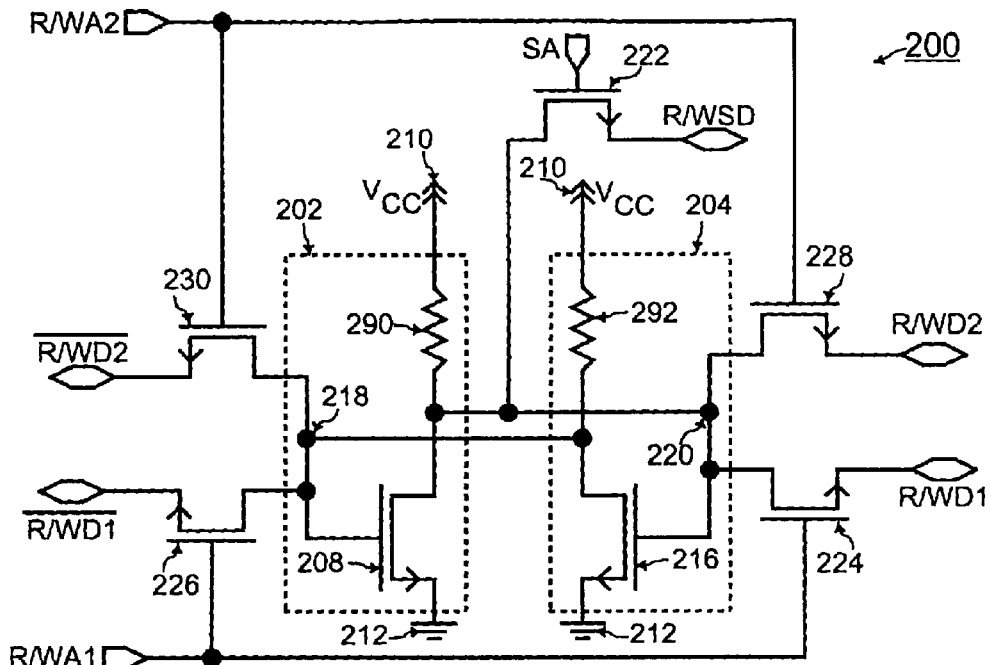
FIG. 7 shows the multiport SRAM cell of FIG. 3 but with pull-up resistors instead of pull-up PMOSFETs (P-channel Metal Oxide Semiconductor Field Effect Transistors) within the bistable loop of inverters, according to an alternative embodiment of the present invention.
Figure 8:
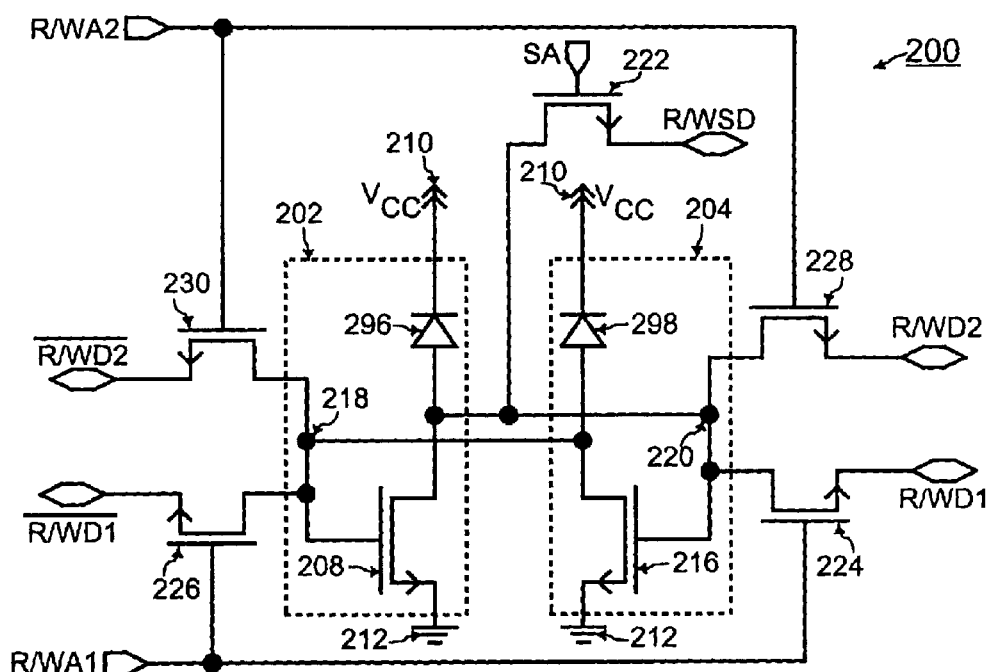
FIG. 8 shows the multiport SRAM cell of FIG. 3 but with reversed-biased diodes instead of pull-up PMOSFETs (P-channel Metal Oxide Semiconductor Field Effect Transistors) within the bistable loop of inverters, according to an alternative embodiment of the present invention.

For example, referring to FIG. 7, a first resistor 290 is used instead of the first PMOSFET 206 within the first inverter 202 for pulling-up the voltage at the output of the first inverter 202, in an alternative embodiment of the present invention. Similarly, in FIG. 7, a second resistor 292 is used instead of the second PMOSFET 214 for pulling-up the voltage at the output of the second inverter 204. Alternatively, referring to FIG. 8, a first reverse-biased diode 296 is used instead of the first PMOSFET 206 within the first inverter 202 for pulling-up the voltage at the output of the first inverter 202, in another embodiment of the present invention. Similarly, in FIG. 8, a second reverse-biased diode 298 is used instead of the second PMOSFET 214 for pulling-up the voltage at the output of the second inverter 204. Otherwise, elements having the same reference number in FIGS. 3, 7, and 8 refer to elements having similar structure and function, as already described herein with reference to FIG. 3.

Figure 9:
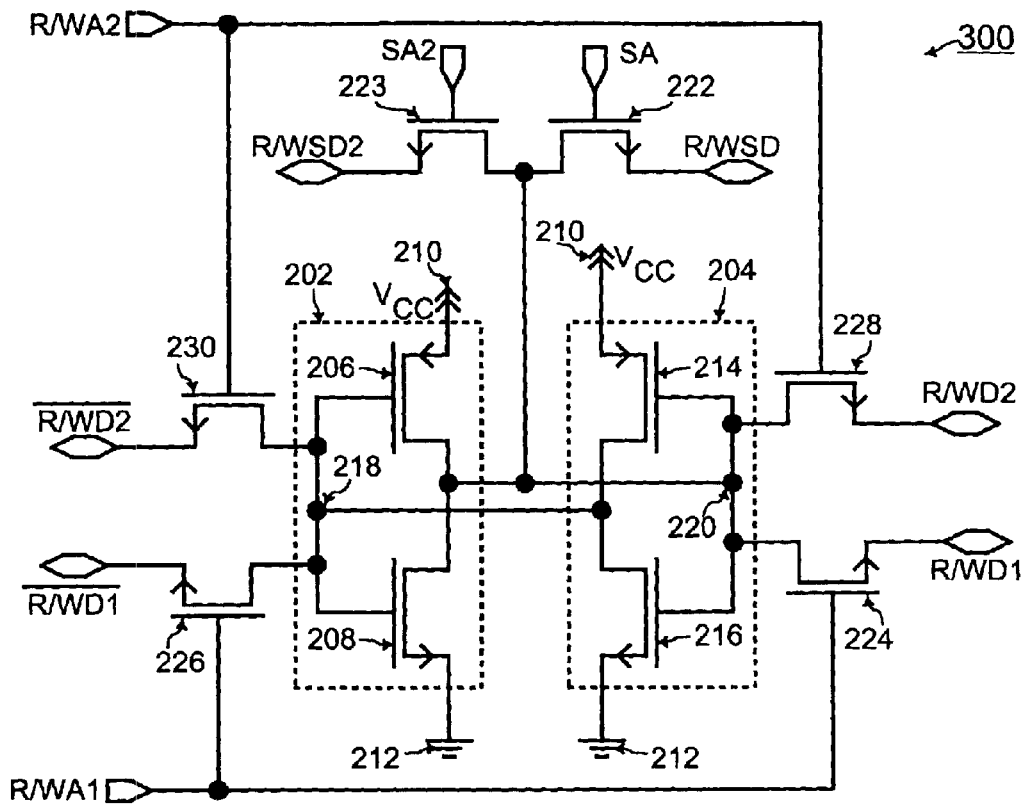
FIG. 9 shows a second implementation of an SRAM cell with a second single-ended port according to another embodiment of the present invention.

Furthermore, the present invention may be practiced with any number of single-ended ports and double-ended ports. For example, a SRAM cell 300 of FIG. 9 is similar to the SRAM cell 200 of FIG. 3 with elements having the same reference number in FIGS. 3 and 9 referring to elements having similar structure and function. However, the SRAM cell 300 of FIG. 9 further includes a second single-ended port comprised of a second single-ended pass transistor 223. The second single-ended pass transistor 223 is an NMOSFET (N-channel metal oxide semiconductor field effect transistor) having a drain coupled to the second bistable node 220 of the bistable loop of the SRAM cell 300, according to one embodiment of the present invention. However, the present invention may be practiced when the drain of the second pass NMOSFET 223 is coupled to either one of the first bistable node 218 or the second bistable node 220. The source of the second single-ended NMOSFET 223 is coupled to a read or write data node having read or write data R/WSD2 applied thereon by a memory accessing device, and the memory accessing device provides a single-ended accessing control signal SA2 to the gate of the second single-ended NMOSFET 223.

Figure 10:
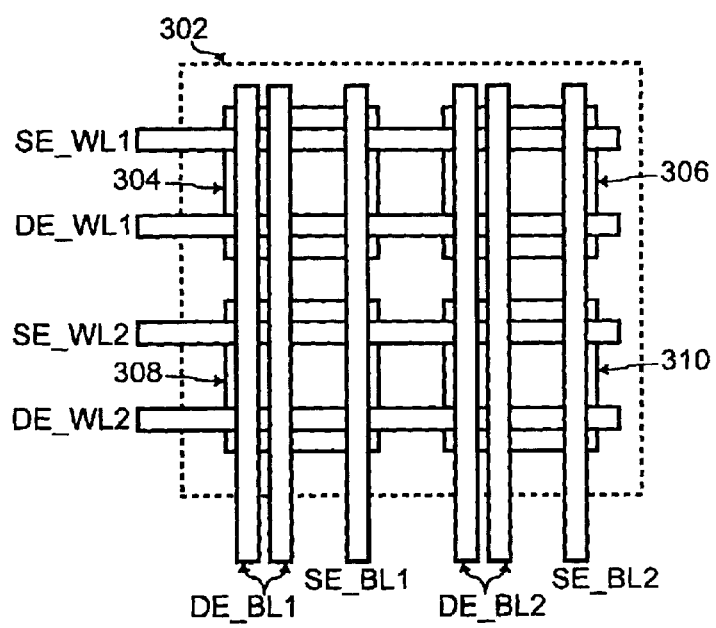
FIG. 10 shows an example array of SRAM cells according to an embodiment of the present invention.

FIG. 10 illustrates the word lines and the bit lines of an array of SRAM cells 302 with each SRAM cell having at least one single-ended port and at least one differential port. The array of SRAM cells 302 includes a first SRAM cell 304, a second SRAM cell 306, a third SRAM cell 308, and a fourth SRAM cell 310. A first single-ended word line (SE_WL1) runs horizontally across the first row of SRAM cells 304 and 306 and is coupled to the respective gate of the single-ended MOSFET comprising the single-ended port for each of the first row of SRAM cells 304 and 306. A first differential word line (DE_WL1) also runs horizontally across the first row of SRAM cells 304 and 306 and is coupled to the respective gates of the pair of differential MOSFETs comprising the differential port for each of the first row of SRAM cells 304 and 306.

In addition, a second single-ended word line (SE_WL2) runs horizontally across the second row of SRAM cells 308 and 310 and is coupled to the respective gate of the single-ended MOSFET comprising the single-ended port for each of the second row of SRAM cells 308 and 310. A second differential word line (DE_WL2) also runs horizontally across the second row of SRAM cells 308 and 310 and is coupled to the respective gates of the pair of differential MOSFETs comprising the differential port for each of the second row of SRAM cells 308 and 310.

Also, a first single-ended bit line (SE_BL1) runs vertically across the first column of SRAM cells 304 and 308 and is coupled to the respective source of the single-ended MOSFET comprising the single-ended port for each of the first column of SRAM cells 304 and 308. A first pair of differential bit line (DE_BL1) also runs vertically across the first column of SRAM cells 304 and 308 and is coupled to the respective sources of the pair of differential MOSFETs comprising the differential port for each of the first column of SRAM cells 304 and 308.

Furthermore, a second single-ended bit line (SE_BL2) runs vertically across the second column of SRAM cells 306 and 310 and is coupled to the respective source of the single-ended MOSFET comprising the single-ended port for each of the second column of SRAM cells 306 and 310. A second pair of differential bit line (DE_BL2) also runs vertically across the second column of SRAM cells 306 and 310 and is coupled to the respective sources of the pair of differential MOSFETs comprising the differential port for each of the second column of SRAM cells 306 and 310. In this manner, with each of the SRAM cells 304, 306, 308, and 310 having a single port and a differential port, each SRAM cell in the array 302 has five signal lines coupled to such a SRAM cell.

The present invention is limited only as defined in the following claims and equivalents thereof.

What is claimed is:

1. A multiport SRAM (static random access memory) cell comprising:

a bistable loop of a first inverter and a second inverter, wherein an input terminal of the first inverter is coupled to an output terminal of the second inverter at a first bistable node, and wherein an input terminal of the second inverter is coupled to an output terminal of the first inverter at a second bistable node;

a single-ended port coupled to one of the first bistable node or the second bistable node;

wherein the single-ended port is operable to both read data from and write data to the bistable node through a same single transistor; and a differential port coupled to both of the first and second bistable nodes, wherein the differential port is operable to both read data from and write data to the bistable nodes through a same pair of transistors.

2. The SRAM cell of claim 1, wherein one of the pair of transistors is coupled to the first bistable node and the other of the pair is coupled to the second bistable node.

3. The SRAM cell of claim 1, wherein the inverters are of substantially the same size.

4. The SRAM cell of claim 1, including a second differential port coupled to both of the first and second bistable nodes.

5. The SRAM cell of claim 1, including a second single-ended port coupled to one of the first bistable node or the second bistable node.

6. The SRAM cell of claim 5, wherein the first and second single-ended ports are coupled to the same bistable node.

7. The SRAM cell of claim 1, wherein the first inverter of the bistable loop is comprised of a first PMOSFET (P-channel metal oxide semiconductor field effect transistor) and a first NMOSFET (N-channel metal oxide semiconductor field effect transistor), and wherein the second inverter of the bistable loop is comprised of a second PMOSFET (P-channel metal oxide semiconductor field effect transistor) and a second NMOSFET (N-channel metal oxide semiconductor field effect transistor), and wherein the first PMOSFET of the first inverter and the second PMOSFET of the second inverter are of substantially the same size, and wherein the first NMOSFET of the first inverter and the second NMOSFET of the second inverter are of substantially the same size.

8. The SRAM cell of claim 1, wherein the single-ended port and the differential port are operable to allow simultaneous access to data within the bistable nodes.

9. The SRAM cell of claim 1, wherein the first inverter of the bistable loop is comprised of a first resistor and a first NMOSFET (N-channel metal oxide semiconductor field effect transistor), and wherein the second inverter of the bistable loop is comprised of a second resistor and a second NMOSFET (N-channel metal oxide semiconductor field effect transistor).

10. The SRAM cell of claim 1, wherein the first inverter of the bistable loop is comprised of a first reverse-biased diode and a first NMOSFET (N-channel metal oxide semiconductor field effect transistor), and wherein the second inverter of the bistable loop is comprised of a second reverse-biased diode and a second NMOSFET (N-channel metal oxide semiconductor field effect transistor).

11. The SRAM cell of claim 1, wherein the cell is one of a plurality of such SRAM cells arranged in an array, each cell of the array coupled to a differential word line, a single-ended word line, a pair of differential bit lines, and a single-ended bit line.

12. The SRAM cell of claim 1, wherein the single-ended port comprises a transmission gate.

13. A multiport SRAM (static random access memory) cell comprising:

a bistable loop of a first inverter and a second inverter, wherein an input terminal of the first inverter is coupled to an output terminal of the second inverter at a first bistable node, and wherein an input terminal of the second inverter is coupled to an output terminal of the first inverter at a second bistable node;

a single-ended port coupled to one of the first bistable node or the second bistable node and operable to both read data from and write data to the coupled bistable node through a same transistor; and a differential port coupled to both of the first and second bistable nodes and operable to both read data from and write data to the coupled bistable nodes through a same pair of transistors.

14. The SRAM cell of claim 13, wherein the single-ended port and the differential port are operable to allow simultaneous access to data within the bistable nodes.

15. The SRAM cell of claim 13, wherein the cell is one of a plurality of such SRAM cells arranged in an array, each cell of the array coupled to a differential word line, a single-ended word line, a pair of differential bit lines, and a single-ended bit line.

16. A multiport SRAM (static random access memory) cell comprising:

a bistable loop consisting of a first CMOS inverter having first and second transistors and a second CMOS inverter having third and fourth transistors, wherein an input terminal of the first inverter is coupled to an output terminal of the second inverter at a first bistable node, and wherein an input terminal of the second inverter is coupled to an output terminal of the first inverter at a second bistable node;

a single-ended port consisting of a fifth transistor coupled to one of the first bistable node or the second bistable node;

wherein the single-ended port is operable to both read data from and write data to the bistable node through the fifth transistor; and a differential port consisting of a sixth transistor coupled to the first bistable node and a seventh transistor coupled to the second bistable node, wherein the differential port is operable to both read data from and write data to the bistable nodes through the sixth and seventh transistors.

17. The SRAM cell of claim 16, wherein the cell is one of a plurality of such SRAM cells arranged in an array, the gate of the fifth transistor of each cell of the array coupled to a single-ended word line, the source of the fifth transistor coupled to a single-ended bit line, the gates of the sixth and seventh transistors of each cell of the array coupled to a differential word line, and the sources of the sixth and seventh transistors coupled to a pair of differential bit lines, respectively.

18. The SRAM cell of claim 16, including a second differential port consisting of a eighth transistor coupled to the first bistable node and a ninth transistor coupled to the second bistable node.

19. A method of accessing data within an SRAM (static random access memory) cell, comprising:

providing a single-ended port within the SRAM cell;

providing a differential port within the SRAM cell;

accessing data within the SRAM cell through the single-ended port simultaneously with accessing data within the SRAM cell through the differential port;

reading data from and writing data to the bistable node through a same transistor of the single-ended port; and reading data from and writing data to the bistable nodes through a same pair of transistors of the differential port.

20. The method of claim 19 wherein accessing data within the SRAM cell comprises one or more of the following steps:

reading data from the SRAM cell simultaneously through the single-ended and differential ports;

reading data from the SRAM cell through the single-ended port simultaneously with writing data to the SRAM cell through the differential port; or reading data from the SRAM cell through the differential port simultaneously with writing data to the SRAM cell through the single-ended port.

21. The method of claim 20 wherein accessing data within the SRAM cell comprises all of the steps.

* * * * *